United States Patent
Horn et al.

(10) Patent No.: US 8,977,803 B2
(45) Date of Patent: Mar. 10, 2015

(54) DISK DRIVE DATA CACHING USING A MULTI-TIERED MEMORY

(75) Inventors: Robert L. Horn, Yorba Linda, CA (US); Jing Booth, San Jose, CA (US); Chandra M. Guda, Lake Forest, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 455 days.

(21) Appl. No.: 13/301,543

(22) Filed: Nov. 21, 2011

(65) Prior Publication Data

US 2013/0132638 A1    May 23, 2013

(51) Int. Cl.
    G06F 12/00    (2006.01)
    G06F 12/08    (2006.01)

(52) U.S. Cl.
    CPC ......... *G06F 12/0871* (2013.01); *Y02B 60/1225* (2013.01); *G06F 12/0897* (2013.01); *G06F 2212/217* (2013.01); *G06F 2212/222* (2013.01); *G06F 2212/6042* (2013.01)
    USPC .................................. 711/103; 711/E12.008

(58) Field of Classification Search
    USPC .......................................... 711/103, E12.008
    See application file for complete search history.

(56) References Cited

U.S. PATENT DOCUMENTS

| | | | |
|---|---|---|---|
| 5,333,138 A | 7/1994 | Richards et al. | |
| 5,581,785 A | 12/1996 | Nakamura et al. | |
| 5,586,291 A | 12/1996 | Lasker et al. | |
| 6,016,530 A | 1/2000 | Auclair et al. | |
| 6,044,439 A | 3/2000 | Ballard et al. | |
| 6,115,200 A | 9/2000 | Allen et al. | |
| 6,275,949 B1 | 8/2001 | Watanabe | |
| 6,429,990 B2 | 8/2002 | Serrano et al. | |
| 6,661,591 B1 | 12/2003 | Rothberg | |
| 6,662,267 B2 | 12/2003 | Stewart | |
| 6,687,850 B1 | 2/2004 | Rothberg | |
| 6,725,342 B1 | 4/2004 | Coulson | |
| 6,754,021 B2 | 6/2004 | Kisaka et al. | |
| 6,785,767 B2 | 8/2004 | Coulson | |
| 6,807,630 B2 | 10/2004 | Lay et al. | |
| 6,909,574 B2 | 6/2005 | Aikawa et al. | |
| 6,968,450 B1 | 11/2005 | Rothberg et al. | |
| 7,017,037 B2 | 3/2006 | Fortin et al. | |
| 7,028,174 B1 | 4/2006 | Atai-Azimi et al. | |
| 7,082,494 B1 | 7/2006 | Thelin et al. | |
| 7,107,444 B2 | 9/2006 | Fortin et al. | |
| 7,120,806 B1 | 10/2006 | Codilian et al. | |
| 7,136,973 B2 | 11/2006 | Sinclair | |
| 7,142,385 B2 | 11/2006 | Shimotono et al. | |
| 7,308,531 B2 | 12/2007 | Coulson | |
| 7,334,082 B2 | 2/2008 | Grover et al. | |
| 7,356,651 B2 | 4/2008 | Liu et al. | |

(Continued)

OTHER PUBLICATIONS

U.S. Appl. No. 12/720,568, filed Mar. 9, 2010, 22 pages.

(Continued)

Primary Examiner — Yong Choe

(57) ABSTRACT

A disk drive is disclosed that utilizes multi-tiered solid state memory for caching data received from a host. Data can be stored in a memory tier that can provide the required performance at a low cost. For example, multi-level cell (MLC) memory can be used to store data that is frequently read but infrequently written. As another example, single-level cell (SLC) memory can be used to store data that is frequently written. Improved performance, reduced costs, and improved power consumption can thereby be attained.

29 Claims, 4 Drawing Sheets

(56) References Cited

U.S. PATENT DOCUMENTS

| | | |
|---|---|---|
| 7,395,452 B2 | 7/2008 | Nicholson et al. |
| 7,411,757 B2 | 8/2008 | Chu et al. |
| 7,424,577 B2 | 9/2008 | Bali et al. |
| 7,461,202 B2 | 12/2008 | Forrer, Jr. et al. |
| 7,472,222 B2 | 12/2008 | Auerbach et al. |
| 7,477,477 B2 | 1/2009 | Maruchi et al. |
| 7,509,471 B2 | 3/2009 | Gorobets |
| 7,516,346 B2 | 4/2009 | Pinheiro et al. |
| 7,610,438 B2 | 10/2009 | Lee et al. |
| 7,613,876 B2 | 11/2009 | Bruce et al. |
| 7,631,142 B2 | 12/2009 | Nishide et al. |
| 7,634,585 B2 | 12/2009 | Conley et al. |
| 7,644,231 B2 | 1/2010 | Recio et al. |
| 7,685,360 B1 | 3/2010 | Brunnett et al. |
| 7,725,661 B2 | 5/2010 | Liu et al. |
| 7,752,491 B1 | 7/2010 | Liikanen et al. |
| 7,831,634 B2 | 11/2010 | Petev et al. |
| 7,861,038 B2 | 12/2010 | Fontenot et al. |
| 7,934,053 B2 | 4/2011 | Chen et al. |
| 7,962,685 B2 | 6/2011 | Cheung et al. |
| 2001/0018728 A1 | 8/2001 | Topham et al. |
| 2005/0125614 A1 | 6/2005 | Royer, Jr. |
| 2005/0172082 A1 | 8/2005 | Liu et al. |
| 2005/0251617 A1 | 11/2005 | Sinclair et al. |
| 2006/0080501 A1 | 4/2006 | Auerbach et al. |
| 2006/0143360 A1 | 6/2006 | Petev et al. |
| 2006/0143427 A1 | 6/2006 | Marwinski et al. |
| 2006/0195657 A1 | 8/2006 | Tien et al. |
| 2006/0248124 A1 | 11/2006 | Petev et al. |
| 2006/0248387 A1 | 11/2006 | Nicholson et al. |
| 2007/0174546 A1 | 7/2007 | Lee |
| 2007/0220202 A1 | 9/2007 | Sutardja et al. |
| 2007/0288692 A1 | 12/2007 | Bruce et al. |
| 2008/0005462 A1 | 1/2008 | Pyeon et al. |
| 2008/0040537 A1 | 2/2008 | Kim |
| 2008/0059694 A1 | 3/2008 | Lee |
| 2008/0130156 A1 | 6/2008 | Chu et al. |
| 2008/0141054 A1 | 6/2008 | Danilak |
| 2008/0141055 A1 | 6/2008 | Danilak |
| 2008/0177938 A1 | 7/2008 | Yu |
| 2008/0209114 A1 | 8/2008 | Chow et al. |
| 2008/0215800 A1 | 9/2008 | Lee et al. |
| 2008/0222353 A1 | 9/2008 | Nam et al. |
| 2008/0244164 A1 | 10/2008 | Chang et al. |
| 2008/0256287 A1 | 10/2008 | Lee et al. |
| 2008/0294846 A1 | 11/2008 | Bali et al. |
| 2008/0307270 A1 | 12/2008 | Li |
| 2009/0019218 A1 | 1/2009 | Sinclair et al. |
| 2009/0024793 A1 | 1/2009 | Fontenot et al. |
| 2009/0031072 A1 | 1/2009 | Sartore |
| 2009/0043831 A1* | 2/2009 | Antonopoulos et al. ...... 707/205 |
| 2009/0103203 A1 | 4/2009 | Yoshida |
| 2009/0106518 A1 | 4/2009 | Dow |
| 2009/0144501 A2 | 6/2009 | Yim et al. |
| 2009/0150599 A1 | 6/2009 | Bennett |
| 2009/0172324 A1 | 7/2009 | Han et al. |
| 2009/0249168 A1 | 10/2009 | Inoue |
| 2009/0271562 A1 | 10/2009 | Sinclair |
| 2009/0327603 A1 | 12/2009 | McKean et al. |
| 2010/0088459 A1 | 4/2010 | Arya et al. |
| 2010/0169604 A1 | 7/2010 | Trika et al. |
| 2010/0268881 A1 | 10/2010 | Galchev et al. |
| 2011/0082985 A1 | 4/2011 | Haines et al. |

OTHER PUBLICATIONS

Hannes Payer, Marco A.A. Sanvido, Zvonimir Z. Bandic, Christoph M. Kirsch, "Combo Drive: Optimizing Cost and Performance in a Heterogeneous Storage Device", http://csl.cse.psu.edu/wish2009_papers/Payer.pdf.

Gokul Soundararajan, Vijayan Prabhakaran, Mahesh Balakrishan, Ted Wobber, "Extending SSD Lifetimes with Disk-Based Write Caches", http://research.microsoft.com/pubs/115352/hybrid.pdf, Feb. 2010.

Xiaojian Wu, A. L. Narasimha Reddy, "Managing Storage Space in a Flash and Disk Hybrid Storage System", http://www.ee.tamu.edu/~reddy/papers/mascots09.pdf.

Tao Xie, Deepthi Madathil, "SAIL: Self-Adaptive File Reallocation on Hybrid Disk Arrays", The 15th Annual IEEE International Conference on High Performance Computing (HIPC 2008), Bangalore, India, Dec. 17-20, 2008.

Non-Volatile Memory Host Controller Interface revision 1.0 specification available for download at http://www.intel.com/standards/nvmhci/index.htm. Ratified on Apr. 14, 2008, 65 pages.

* cited by examiner

| | Write Frequency | Read Frequency | Write Performance Requirement | Read Performance Requirement | Retention Duration | Type of Data | Memory Tier |
|---|---|---|---|---|---|---|---|
| A. | Frequent | Don't care | Don't care | Don't care | Don't care | Don't care | SLC NAND Tier |
| B. | Infrequent/Average | Frequent | Don't care | Don't care | Long | Don't care | SLC NAND Tier |
| C. | Infrequent/Average | Frequent | High | Don't care | Short/Average | Don't care | SLC NAND Tier |
| D. | Infrequent/Average | Frequent | Low/Average | High | Short/Average | Non-Boot/ Non-Resume Data | MLC NAND Tier |
| E. | Infrequent/Average | Frequent | High | Low/Average | Short/Average | Don't care | SLC NAND Tier |
| F. | Infrequent/Average | Frequent | Low/Average | Low/Average | Short/Average | Non-Boot/ Non-Resume Data | MLC NAND Tier |
| G. | Don't care | Don't care | Don't care | High | Long | Boot/Resume Data | SLC NAND Tier |
| H. | Infrequent | Infrequent | Don't care | Average | Don't care | Non-Boot/ Non-Resume Data | Magnetic Storage Tier |

*FIGURE 4*

DISK DRIVE DATA CACHING USING A MULTI-TIERED MEMORY

BACKGROUND

1. Technical Field

This disclosure relates to disk drives, including but not limited to hybrid disk drives that include both magnetic and solid state storage. More particularly, the disclosure relates to systems and methods for storing data in a multi-tier memory architecture that includes solid-state memory.

2. Description of the Related Art

Non-volatile memory devices typically provide better performance for reading and writing data than magnetic media. Accordingly, in storage devices it is advantageous to utilize non-volatile memory for storing data. However, a problem with using non-volatile memory for storing data is that reliability of non-volatile memory degrades over time.

Non-volatile memory devices can typically endure a limited number of write cycles over their useful life. Various factors can contribute to data errors in non-volatile memory devices, which include charge loss or leakage over time, read disturb, and device wear caused by program-erase cycles. Non-volatile memory degradation can cause stored data to be corrupted. For example, when the number of bit errors on a read operation exceeds the ECC (error correction code) correction's capability of the non-volatile memory device, a read operation fails.

BRIEF DESCRIPTION OF THE DRAWINGS

Systems and methods that embody the various features of the invention will now be described with reference to the following drawings, in which:

FIG. 4 illustrates several examples of storing data in a multi-tier memory architecture in accordance with one embodiment of the invention.

DETAILED DESCRIPTION OF SPECIFIC EMBODIMENTS

Figure 1:
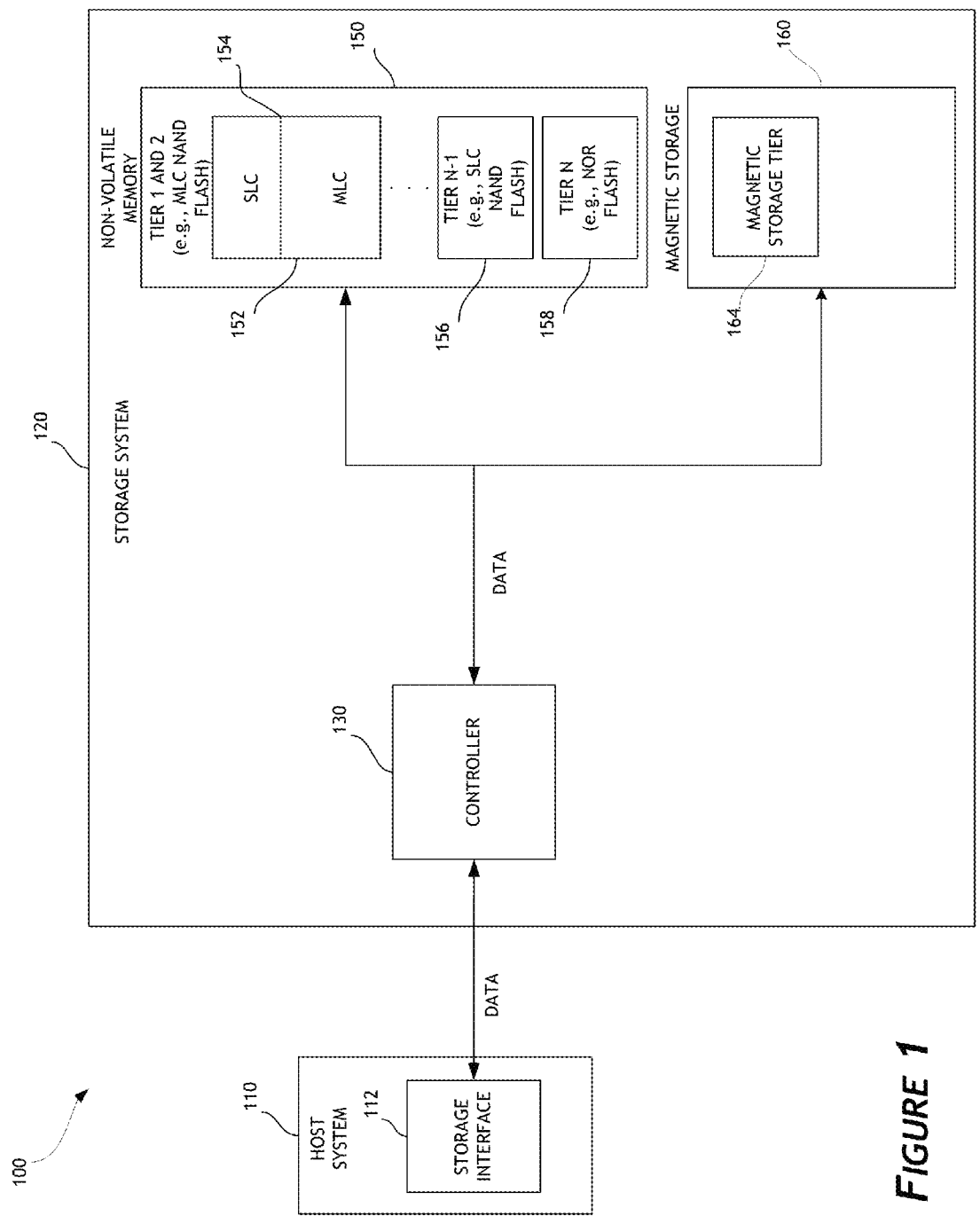
FIG. 1 is a block diagram illustrating a storage device that implements mechanisms for storing data in a multi-tier memory architecture in accordance with one embodiment of the invention.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

Non-volatile memory (NVM) devices (e.g., flash memory and other types of solid-state memory devices) store information in an array of memory cells. In single-level cell (SLC) non-volatile memory, each cell stores a single bit of information. In multi-level cell (MLC) non-volatile memory, each cell stores two or more bits of information. Non-volatile memory has a limited usable life that is measured by the number of times data can be written to a specific NVM location. As NVM wear increases (e.g., number of program-erase cycles increases), the reliability and data retention of NVM decreases. MLC non-volatile memory (e.g., MLC NAND) is cheaper than SLC non-volatile memory, but tends to have slower access time, lower endurance, and lower data retention. MLC non-volatile memory can be configured to operate in SLC mode, such that a single bit of information is stored in the memory cell. MLC memory configured to operate in SLC mode provides better endurance and data retention than MLC memory configured to operate in MLC mode.

To improve performance, some disk drives take advantage of the speed of non-volatile memory to store certain data in non-volatile memory. This data can include frequently accessed data and data accessed at start-up. Disk drives that comprise non-volatile memory cache in addition to magnetic storage are referred to as "hybrid hard disk drives" or "hybrid hard drives" throughout this disclosure. In some hybrid hard drives, MLC NVM can be a good choice for cache storage due to its low cost and high storage density. Non-volatile memory is typically used both as read cache (e.g., a copy of data exists in magnetic storage) and write cache (e.g., data stored in NVM cache is the most recent version than data stored in magnetic storage).

In some embodiments of the present invention, multi-tiered memory that comprises two or more non-volatile memory tiers can be used for storing data received from a host. For example, both SLC and MLC memory modules can be utilized or a portion of an MLC memory module can be configured to operate in SLC mode. Depending on its characteristics, data can be stored in an appropriate memory tier. These characteristics of data include write frequency, read frequency, write performance, read performance, retention duration, type of data, etc. The attributes of different memory tiers can also be considered when identifying the appropriate memory tier for storing data. For example, because MLC memory has similar read performance but inferior endurance and retention characteristics in comparison to SLC memory, MLC memory can be used to store data that is frequently read but infrequently written. As another example, SLC memory can be used to store data with higher write performance and/or retention requirements, such as to store data that is frequently read and frequently written. As yet another example, data used during system initialization (e.g., power up) can be stored in SLC memory because its performance characteristics are superior to those of MLC memory. Alternatively, system data used during system initialization can be stored in MLC memory operating in SLC mode.

In some embodiments, using a multi-tiered memory architecture to store data provides for improved performance because data can be stored in a memory tier that is appropriate for meeting the performance requirements. Reduced costs can also be achieved because some data can be stored in MLC memory, which is cheaper than SLC memory. In addition, caching data in the non-volatile memory can result in improved power consumption. Although this disclosure uses SLC and MLC memory as examples, other types of memory with different characteristics may be used in accordance with the tiered approaches disclosed herein.

System Overview

FIG. 1 illustrates a system 100 that implements mechanisms for storing data in a multi-tier memory architecture in accordance with one embodiment of the invention. As shown, a storage system 120 (e.g., a hybrid hard drive) includes a controller 130, non-volatile memory module 150, and magnetic storage module 160, which comprises magnetic media 164 (e.g., a magnetic disk). As is illustrated, non-volatile memory module 150 can comprise one or more non-volatile solid-state memory arrays, which can embody multiple tiers. In one embodiment, non-volatile memory module 150 can comprise N tiers. For example, MLC NAND flash 152 can be partitioned (as reflected by line 154) into tier 1, which operates in SLC mode, and tier 2, which operates in MLC mode. Tier N-1 156 can be SLC NAND flash. Tier N 158 can be NOR flash. Other types of non-volatile memory can be used as tiers, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), or other discrete NVM (non-volatile memory) chips.

In one embodiment, magnetic media 164 can be utilized as another memory tier. The magnetic media can further comprise multiple tiers. For example, because more data fits in tracks of the outer diameter of a magnetic disk, the outer diameter provides higher performance than the inner diameter. Accordingly, the magnetic media can be partitioned into outer diameter and inner diameter tiers. Certain types of data, such as data that is sequentially stored and accessed (e.g., a movie, video, music, etc.) can be stored in the magnetic storage tier 164.

The controller 130 can be configured to receive data and/or storage access commands from a storage interface module 112 (e.g., a device driver) in a host system 110. Storage access commands communicated by the storage interface 112 can include write and read commands issued by the host system 110. Read commands can specify a logical block address(es) in the storage system where data is stored. Write or program commands can comprise data to be written to the storage system along with logical block address(es) where data should be written. The controller 130 can execute the received commands in the non-volatile memory module 150 or in the magnetic storage module 160. In one embodiment, the controller can include memory (e.g., DRAM) for storing data, such as system data. In one embodiment, the controller can adjust partitioning (reflected by line 154) of MLC NAND flash 152 during operation in response to various conditions. For example, the host system 110 may be storing a large amount of frequently written data in the storage system 120, and the size of SLC partition may need to be increased to accommodate this data.

Storage system 120 can store data communicated by the host system 110. That is, the storage system 120 can act as memory storage for the host system 110. To facilitate this function, the controller 130 can implement a logical interface. Logical interface can present to the host system 110 storage system's memory as a set of logical addresses (e.g., contiguous address) where data can be stored. Internally, the controller 130 can map logical addresses to various physical memory addresses in the magnetic media 164 and/or the non-volatile memory module 150.

In one embodiment, the non-volatile memory module 150 can store data communicated by the host system 110 in the non-volatile memory. In one embodiment, at least a portion of non-volatile memory module 150 can be used as a cache (e.g., read cache and/or a write cache). In another embodiment, entire non-volatile memory module 150 can be used as cache. When a portion of (or entire) the non-volatile memory is used as a read cache, a copy of data also exists in the magnetic storage 160. When a portion of (or entire) non-volatile memory is used as a write cache, data stored in non-volatile memory is a more recent version than data stored in the magnetic storage 160. To improve performance of the storage system 120 and/or host system 110, in some embodiments, various types of data can be stored in non-volatile memory cache, including frequently accessed data, data accessed at start-up (e.g., following a reset or power down), system data (e.g., operating system data such as registry data, swap files, etc.), sequentially accessed data, etc.

Multi-Tier Memory Architecture

Figure 2:
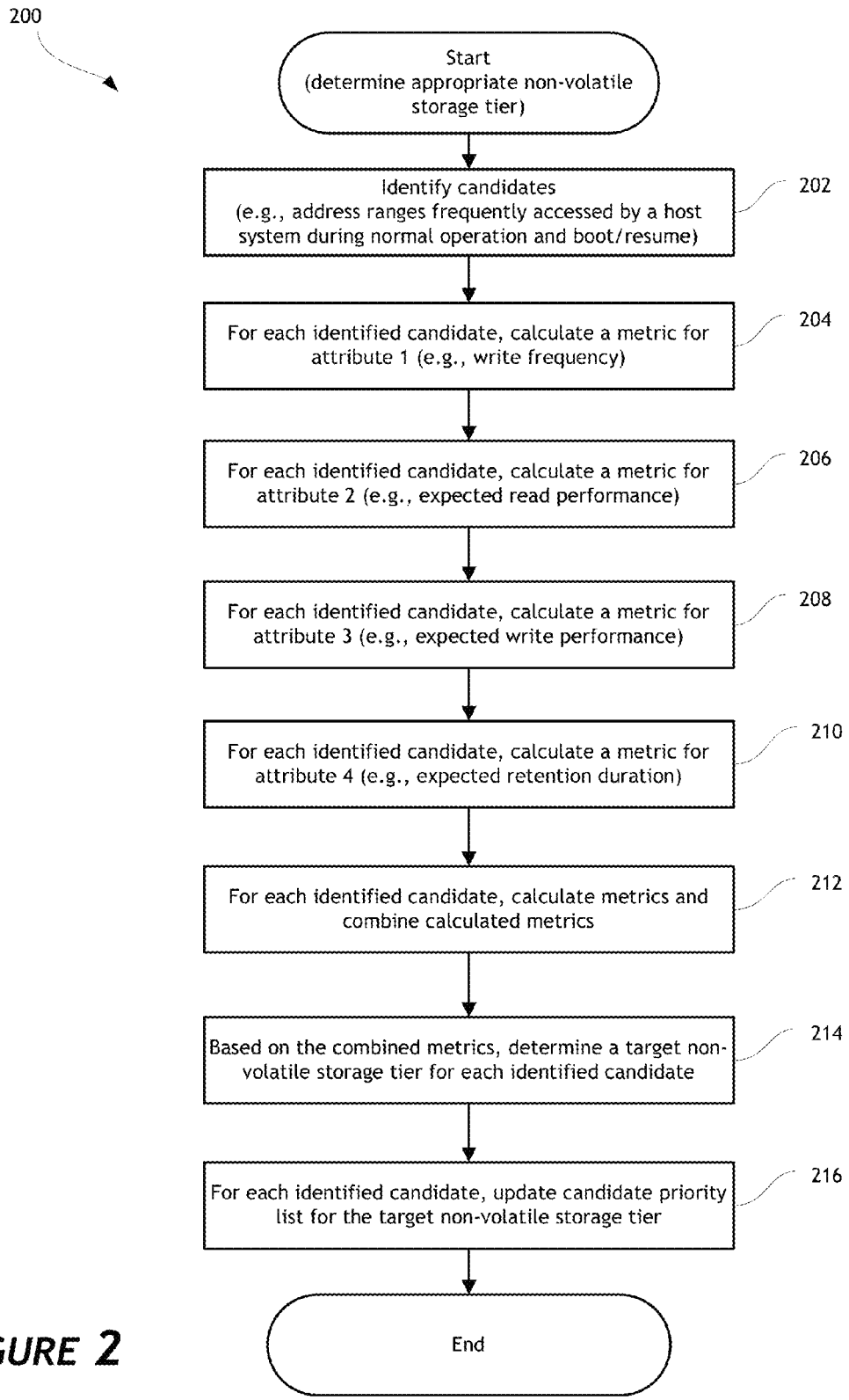
FIG. 2 is a flow diagram illustrating mechanisms for storing data in a multi-tier memory architecture in accordance with one embodiment of the invention.

FIG. 2 illustrates mechanisms for storing data in a multi-tier memory architecture in accordance with one embodiment of the invention. The process 200 can be implemented by the controller 130 of a storage system 120, such as a hybrid disk drive. In one embodiment, the process 200 is executed when a new storage access command (e.g., read and/or write command) is received from the host system 110. The main purpose of this process is to select the appropriate memory tiers for caching particular data elements based on information regarding how such data elements will likely be accessed. The process makes use of statistical data regarding past accesses and access patterns.

The process 200 starts in block 202 where a set of candidates for being stored in the non-volatile memory cache is identified. In one embodiment, the process 200 can analyze storage access commands received from the host, determine access patterns, and compute statistics. Statistics can be determined in order to compile a history of how the host system 110 accesses data stored in the storage system 120. Statistics can additionally be used to predict how the host system 110 will access the data. Data can be stored in an appropriate memory tier based on the compiled history.

In one embodiment, the process 200 can identify a set of logical address range(s) of the storage system memory (e.g., locations in magnetic media) that are frequently accessed by the host during initialization and normal operation. In one embodiment, frequency of access can be determined in relation to the average access rate of storage system memory by the host. For example, the average rate of read and write commands communicated by the host system to address ranges can be monitored. Frequently accessed address ranges can be identified as those address ranges that are accessed in excess of the monitored average access rate. In one embodiment, two counts can be maintained and updated (e.g., incremented): a read counter corresponding to read commands and a write counter corresponding to write commands.

In one embodiment, a threshold for identifying which logical address range(s) are frequently accessed can be adjusted over time to be more selective or less selective. In one embodiment, the process can identify two sets of frequently accessed address ranges: one corresponding to initialization data and the other corresponding to data used during normal operation.

In blocks 204, 206, 208, and 210, the process calculates metrics for various attributes corresponding to data stored or intended by the host system to be stored in the set of address ranges indentified in block 202. In one embodiment, these attributes can correspond to write frequency of data, read frequency of data, expected read performance (e.g., expected performance of retrieving data), expected write performance (e.g., expected performance of programming data), expected retention duration of data (e.g., how long data is expected to be stored in the storage system), and so on. The process 200 can use one or more of these attributes to predict how the host system 110 will access the data.

In one embodiment, write and read frequencies can be determined via counters that are updated each time the address range is accessed (e.g., written or read) by the host system. Expected read performance can be determined by analyzing whether the host system retrieves data stored in the address range as part of a larger burst of read commands, during which performance expectations of the storage system 120 are higher than during execution of isolated read commands. Expected write performance can be determined by analyzing whether the host system stores data in the address range as part of a larger burst of write commands, during which performance expectations of the storage system 120 are higher than during execution of isolated write commands. Expected retention duration can be determined by analyzing the time between successive host accesses to data stored in the address range.

In block 212, the process calculates a total metric and/or combines calculated metrics corresponding to the attributes. A total metric can be calculated or calculated metrics can be combined according to a linear combination, such as a simple average or weighted average, non-linear combination, regression analysis, etc. In block 214, the process identifies an appropriate memory tier for storing data. In one embodiment, a weighted average can be determined by assigning, for example, a 15% weight to read frequency, a 25% weight to write frequency, a 15% weight to expected read performance, a 25% weight to expected write performance, and a 20% weight to expected retention duration. For example, data with longer expected retention duration may be a candidate for being stored in the SLC NAND tier. In one embodiment, calculation of the total metric and/or combining calculated metrics can be varied during operation. For example, the process 200 can be learning and/or adaptive. The process 200 can be responsive to operating conditions, such as, free amount of total NVM memory or free amount of memory in any particular memory tier, characteristics of data stored by the host system, and/or a combination thereof. In one embodiment, candidates identified by process 200 can be stored in a single list or separate lists for each memory tier.

In one embodiment, in block 216, the process can update the single list or separate lists by placing an entry that corresponds to the address range and/or data stored or intended to be stored in the set of address ranges identified in block 202. The single list or separate lists can be ordered according to the calculated total and/or combined metric determined in block 212. Although four attributes are shown, other embodiments may use fewer or more attributes. If there are other candidates in the set identified in block 202, the process 200 can transition to block 204 and consider other candidates. The process terminates when there are no more remaining candidates in the set identified in block 202.

Other attributes of data can be utilized by the process 200. In one embodiment, the retention (or reliability) of the non-volatile memory can be determined and used as a factor. Retention (or reliability) can correspond to the estimated remaining usable life of the non-volatile memory. The remaining usable life can be determined based partially or wholly on the estimated number of remaining program-erase cycles that the NVM can endure. For example, this can be measured by tracking the total number of bytes that have been written to the NVM, tracking the number of errors encountered when reading data stored in the NVM (e.g., as determined by an error correction mechanism), selecting or determining voltage threshold levels or voltage reference values when reading data from MLC flash memory, adjusting parameters of programming algorithm parameters (e.g., programming time, erase time, etc.) when storing data in the NVM, etc.

In one embodiment, the remaining usable life (or other reliability measure) can be determined by a signal processing subsystem. The non-volatile memory module 150 can include a bridge device coupled with the non-volatile memory module via an interface such as ONFI. The bridge device can be further configured to communicate with the controller 130 over a high speed interface such as PCIe and to provide to the controller physical, page-level access/control to non-volatile memory. The bridge device can perform basic signal processing and channel management of non-volatile memory. This architecture is described in a co-pending patent application Ser. No. 13/226,393, entitled "SYSTEMS AND METHODS FOR AN ENHANCED CONTROLLER ARCHITECTURE IN DATA STORAGE SYSTEMS," filed Sep. 6, 2011, the disclosure of which is hereby incorporated by reference in its entirety. In other embodiments, a bridge device may not be used and the non-volatile memory module 150 may be controller directly by the controller 130.

Figure 3:
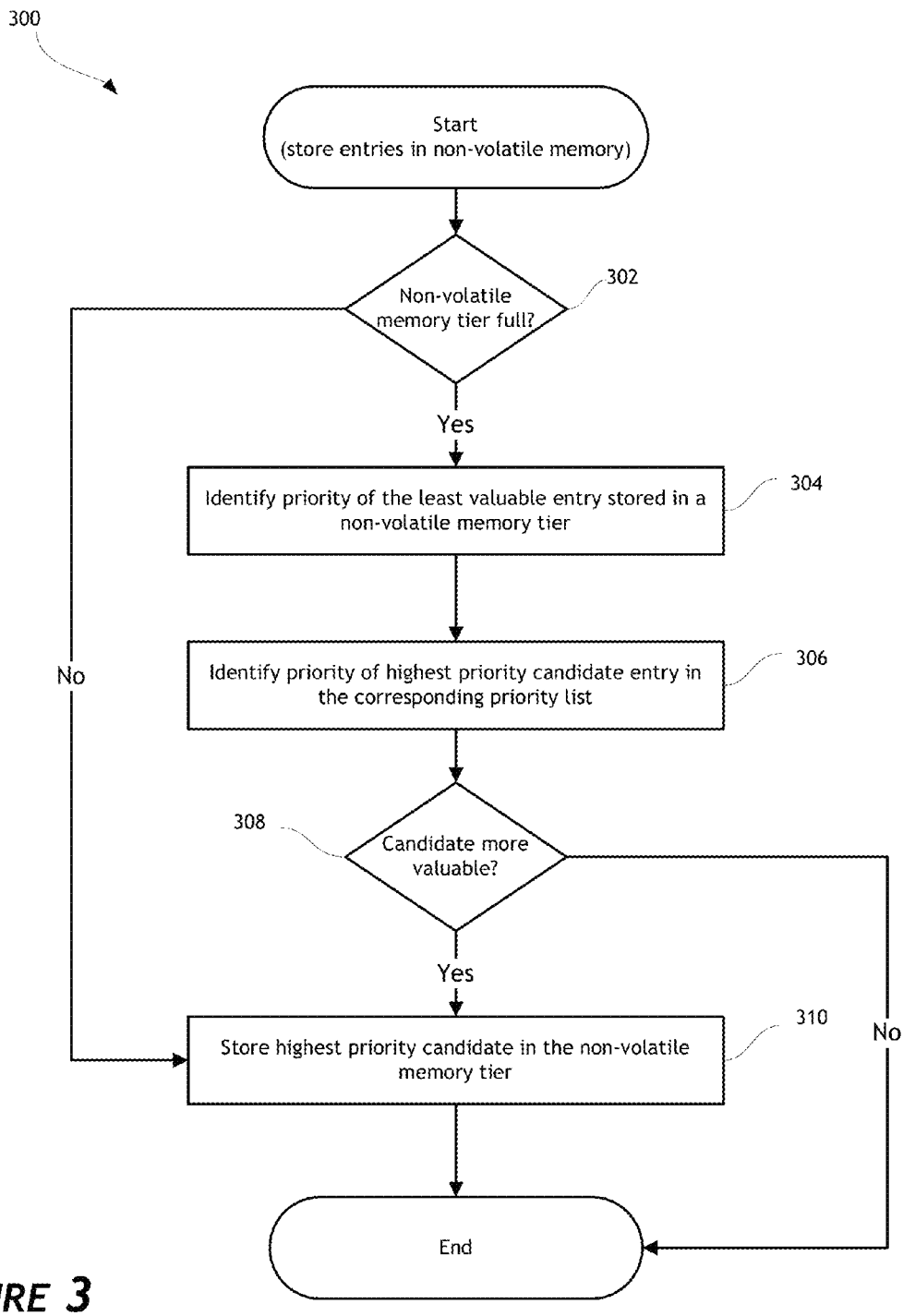
FIG. 3 is a flow diagram illustrating mechanisms for storing data in a multi-tier memory architecture in accordance with one embodiment of the invention.

FIG. 3 is a flow diagram illustrating mechanisms for storing data in a multi-tier memory architecture in accordance with one embodiment of the invention. The process 300 can be implemented by the controller 130 of a storage system 120, such as a hybrid disk drive. In one embodiment, the process 200 illustrated in FIG. 2 can analyze storage access commands received from the host, determine access patterns, and compute statistics. The process 300 illustrated in FIG. 3 can store entries (e.g., candidates identified by process 200) in the storage system 120. For example, the controller 130 can store the entries in memory (e.g., DRAM). In one embodiment, processes 200 and 300 can be executed in parallel. In another embodiment, processes 200 and 300 can be executed serially or in a combination of parallel and serial execution.

The process 300 starts in block 302 where it determines whether a particular non-volatile memory tier (e.g., SLC NAND tier 156) is full. As explained above, storage system 120 and non-volatile memory 150 can be partitioned into tiers. In one embodiment, the process 300 can be separately executed for each memory tier of storage system 120.

If the particular memory tier is not full, the process transitions to block 310. Because there is available space in the memory tier, the process 300 can simply store candidates in the memory tier. In one embodiment, the process 300 can store the highest priority candidate, as explained below.

If the particular memory tier is full, the process 300 determines whether any entries already stored in the tier should be replaced. In one embodiment, in block 304 the process identifies a least valuable entry (based on the metric) stored in the memory tier. For example, the least valuable entry can be selected as the entry having the lowest calculated total and/or combined metric determined in block 212. The process transitions to block 306 where it identifies a most valuable candidate to be stored in the memory tier. The process can select an entry having the highest calculated total and/or combined metric from the list of candidates for the memory tier (e.g., the list updated in block 216).

In block 308, the process determines whether the candidate identified in block 306 is more valuable than the memory tier entry identified in block 304. In one embodiment, the process compares calculated total and/or combined metrics of the identified candidate and entry. If the candidate is more valuable, the process transitions to block 310 where the entry is replaced with the candidate. The process 300 can store in the memory tier data stored or intended to be stored in the set of address ranges corresponding to the candidate. Information identifying or corresponding to the address range can also be stored. If, in block 308, the candidate is determined to be less valuable, the process skips block 310. The process can return to block 302 and repeat the above described steps for other memory tiers. In one embodiment, the process 300 terminates when all memory tiers have been considered. In another embodiment, the process 300 can terminate after considering a subset of memory tiers or a single memory tier. For example, during power loss or shut down, the process 300 can consider only the NVM memory tier because the magnetic disk tier may not be available.

Examples of Utilizing Multi-Tier Memory Architecture

FIG. 4 illustrates several examples of storing data in a multi-tier memory architecture in accordance with one embodiment of the invention. The table 400 illustrates appropriate tiers (shown in column 440) for storing several types of data having various attributes listed in columns 422, 424, 426, 428, 430, and 432. An entry is marked as "Don't Care" reflects that the attribute can assume any characteristic.

Row A 402 provides an example of storing data that is frequently written and whose remaining attributes are "don't care." For example, this type of data can correspond to data used by an active user application (e.g., an Internet browser). Because the endurance of MLC memory is lower than that of SLC memory, the appropriate tier for this type of data is the SLC NAND tier (e.g., SLC NAND or MLC NAND configured to operate in SLC mode).

Row B 404 provides an example of storing data that is frequently read and whose expected retention duration is higher than normal or average expected retention duration. For example, this type of data can correspond to certain operating system data (e.g., registry data). Because the retention and endurance of SLC memory is higher than that of MLC memory, the appropriate tier for this type of data is the SLC NAND tier.

Row C 406 provides an example of storing data that requires high write performance and that is also frequently read. For example, this type of data can correspond to data that is written as part of a larger burst of write operations received from the host system. Because MLC memory has longer programming time than SLC memory and thus inferior write performance, the appropriate tier for this type of data is the SLC NAND tier.

Row D 408 provides an example of storing data that requires high read performance, is frequently read, and is not data that is accessed during initialization. For example, this type of data can correspond to data that is accessed as a part of a larger burst of read operations received from the host system. Because MLC memory has read performance that is comparable to that of SLC memory, the appropriate tier for this type of data is the MLC NAND tier.

Row E 410 provides an example of storing data that is frequently read and that also requires high write performance. Because MLC memory has longer programming time than SLC memory, the appropriate tier for this type of data is the SLC NAND tier.

Row F 412 provides an example of storing data that is frequently read, is not data that is accessed during initialization, and whose remaining attributes are average or below average. For example, this type of data can correspond to certain operating system data (e.g., dynamically linked library data). Because MLC memory has read performance that is comparable to that of SLC memory, the appropriate tier for this type of data is the MLC NAND tier.

Row G 414 provides an example of storing data that requires high read performance and longer retention and that is also used during initialization. For example, this type of data can correspond to system data that is loaded during power up, after restart, and/or upon system resume. Because SLC memory has better endurance and retention than MLC memory, the appropriate tier for this type of data is the SLC NAND tier.

Row H 416 provides an example of storing data that is infrequently written, infrequently read, requires average read performance, and is not used during initialization. For example, this type of data can correspond to a movie, video, or music data. The appropriate tier for this type of data is the magnetic storage tier, especially if data is part of a larger data set that is sequentially accessed.

Conclusion

In some embodiments, utilizing multi-tiered memory allows hybrid hard drives to improve performance, reduce cost, and improve power consumption. Depending on its characteristics, data received from the host can be stored in a memory tier that provides an appropriate balance of performance and cost. Characteristics of data can include write frequency, read frequency, write performance, read performance, retention duration, type of data, whether data is accessed sequentially, remaining life of non-volatile memory tier(s), etc. Statistics reflecting these characteristics can be collected over time and complied into a history, based on which data can be stored in an appropriate memory tier.

Other Variations

As used in this application, "non-volatile memory" typically refers to solid-state memory such as, but not limited to, NAND flash. However, the systems and methods of this disclosure may also be useful in more conventional hard drives and hybrid drives including both solid-state and hard drive components. The systems and methods of this disclosure may also be useful for a RAID system (e.g., server RAID system) having multiple storage devices, such as, a storage module with SLC flash, a storage module with MLC flash, a storage module with magnetic storage, etc. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

Those skilled in the art will appreciate that in some embodiments, other types of caching policies can be implemented. In addition, the actual steps taken in the processes shown in FIGS. 2-4 may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. As another example, various memory tiers disclosed herein can be part of a storage module and/or device or can be separated into different storage modules and/or devices, such as, when used in a RAID system. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. In a disk drive system comprising a magnetic medium and a multi-level cell (MLC) non-volatile memory module comprising a single-level cell (SLC) memory tier and an MLC memory tier, a method of caching data in the non-volatile memory, the method comprising:
maintaining first and second candidate lists of data values corresponding to addresses in the magnetic medium to be considered for caching, the maintaining comprising:
in response to receiving a storage access command from a host, the storage access command comprising an address in the magnetic medium configured to store a data value, determining a metric corresponding to a frequency of access by the host;
determining a placement of the data value in one of the first and second candidate lists based on:
comparing the metric to a first threshold, and if the metric exceeds the first threshold, determining the placement of the data value in the first candidate list; and
if the metric does not exceed the first threshold, comparing the metric to a second threshold, and if the metric exceeds the second threshold, determining the placement of the data value in the second candidate list; and
selectively programming entries in the first and second candidate lists in the SLC memory tier or the MLC memory tier.

2. The method of claim 1, wherein determining the metric comprises combining at least two of the following: write frequency, write performance, read frequency, read performance, and retention duration.

3. The method of claim 2, wherein the combining further comprises computing an average.

4. The method of claim 3, wherein the average is a weighted average.

5. The method of claim 1, wherein entries in the first candidate list are ordered according to their metrics and entries in the second candidate list are ordered according to their metrics.

6. The method of claim 5, wherein selectively replacing data in the at least one of SLC and MLC memory tiers determined to be full further comprises replacing a lowest priority entry in the SLC memory tier with a highest priority data value in the first candidate list provided that a metric of the highest priority entry in the first candidate list exceeds a metric of the lowest priority data value in the SLC memory tier.

7. The method of claim 5, wherein selectively replacing data in the at least one of SLC and MLC memory tiers determined to be full further comprises replacing a lowest priority entry in the MLC memory tier with a highest priority entry in the second candidate list provided that a metric of the highest priority entry in the second candidate list exceeds a metric of the lowest priority entry in the MLC memory tier.

8. The method of claim 1, wherein determining the metric comprises combining at least a read frequency and a write frequency.

9. The method of claim 8, wherein the read frequency corresponds to tracking a frequency of read commands comprising the address and the write frequency corresponds to tracking a frequency of write commands comprising the address.

10. The method of claim 9, wherein tracking the frequency of read commands comprises incrementing a first counter and the tracking the frequency of write commands comprises incrementing a second counter.

11. A disk drive system for storing data received from a host, the system comprising:
a magnetic medium configured to store data;
a non-volatile memory capable of supporting both a multi-level cell (MLC) memory tier and a single-level cell (SLC) memory tier; and
a controller configured to access at least the non-volatile memory in response to receiving a storage access command from the host, the storage access command comprising an address in the magnetic medium configured to store a data value, the controller further configured to:
determine a metric corresponding to a frequency of access by the host;
determine a placement of the data value in one of first and second candidate lists based on:
comparing the metric to a first threshold, and if the metric exceeds the first threshold, determining the placement of the data value in the first candidate list; and
if the metric does not exceed the first threshold, comparing the metric to a second threshold, and if the metric exceeds the second threshold, determining the placement of the data value in the second candidate list; and
selectively program entries in the first and second candidate lists into the SLC memory tier or the MLC memory tier.

12. The system of claim 11, wherein the controller is further configured to determine the metric by combining at least two of the following: write frequency, write performance, read frequency, read performance, and retention duration.

13. The system of claim 12, wherein the read frequency corresponds to tracking a frequency of read commands comprising the address and the write frequency corresponds to tracking a frequency of write commands comprising the address.

14. The system of claim 11, wherein the controller is further configured to order entries in the first candidate list according to their metrics and to order entries in the second candidate list according to their metrics.

15. The system of claim 14, wherein the controller is further configured to program a highest priority entry in the first candidate list in the SLC memory tier provided that a metric of the highest priority entry in the first candidate list exceeds a metric of a lowest priority entry in the SLC memory tier.

16. The system of claim 15, wherein the highest priority entry comprises data used by the host during initialization.

17. The system of claim 16, wherein the controller is further configured to program a highest priority entry in the second candidate list into the MLC memory tier provided that a metric of the highest priority entry in the second candidate list exceeds a metric of a lowest priority entry in the MLC memory tier.

18. The system of claim 11, wherein the non-volatile memory comprises MLC memory.

19. The system of claim 11, wherein the controller is further configured to increment a first counter in response to receiving a read command comprising the address and increment a second counter in response to receiving a write command comprising the address.

20. The system of claim 19, wherein the controller is further configured to combine by computing an average.

21. The system of claim 20, wherein the average is a weighted average.

22. In a disk drive system comprising a magnetic medium and non-volatile memory that comprises at least first and second tiers of storage, a method of caching data in the non-volatile memory, the method comprising:
- maintaining first and second candidate lists of entries corresponding to logical address ranges in the magnetic medium to be considered for caching, the maintaining comprising:
  - identifying a plurality of logical address ranges that are frequently accessed by a host, each logical address range in the plurality of logical address ranges corresponding to one or more locations in the magnetic medium;
  - for each logical address range in the plurality of logical address ranges that are frequently accessed by the host:
    - determining a metric corresponding to a combination of at least two of the following: write frequency, write performance, read frequency, read performance, and retention duration;
    - determining a placement of an entry corresponding to the logical address range in one of the first and second candidate lists based on a comparison of the metric to one or more thresholds, wherein entries in the first and second candidate lists are ordered according to their metrics; and
- programming entries in the first and second candidate lists in the non-volatile memory, the programming comprising:
  - replacing a lowest priority entry in the first tier storage with a highest priority entry in the first candidate list when a metric of the highest priority entry in the first candidate list exceeds a metric of the lowest priority entry in the first tier storage; and
  - replacing a lowest priority entry in the second tier storage with a highest priority entry in the second candidate list when a metric of the highest-priority entry in the second candidate list exceeds a metric of the lowest priority entry in the second tier storage.

23. The method of claim 22, wherein the entry comprises a data value intended to be stored in a location corresponding to the logical address range.

24. The method of claim 22, wherein identifying the plurality of logical address ranges that are frequently accessed by the host comprises identifying logical address ranges that are frequently accessed during an initialization of the host or during a normal operation of the host.

25. The method of claim 22, wherein the non-volatile memory comprises solid-state memory.

26. The method of claim 22, wherein the non-volatile memory comprises at least another additional tier of storage.

27. A method of caching data in solid state memory of a disk drive, the method comprising:
- receiving a first unit of data from a host system;
- calculating at least one metric that represents a prediction of how the first unit of data will be accessed by the host system, said metric being dependent upon at least (1) a write address used by the host system to write the first unit of data to the disk drive, and (2) statistical data reflective of prior accesses by the host system to the disk drive;
- selecting, based at least partly on the metric, a memory tier in which to cache the first unit of data, wherein selecting the memory tier comprises selecting between at least a first tier composed of single-level cell (SLC) memory and a second tier composed of multi-level cell (MLC) memory; and
- in response to determining that at least one of first and second memory tiers is full, selectively replacing a second unit of data in the at least one first and second memory tiers determined to be full with the first unit of data.

28. In a disk drive system comprising a magnetic medium and a multi-level cell (MLC) non-volatile memory module comprising a single-level cell (SLC) memory tier and an MLC memory tier, a method of caching data in the non-volatile memory, the method comprising:
- maintaining first and second candidate lists of data values corresponding to addresses in the magnetic medium to be considered for caching, the maintaining comprising:
  - in response to receiving a storage access command from a host, the storage access command comprising an address in the magnetic medium configured to store a data value, determining a metric corresponding to a frequency of access by the host;
  - determining a placement of the data value in one of the first and second candidate lists based on a comparison of the metric to a threshold; and
- selectively programming entries in the first and second candidate lists in the SLC memory tier or the MLC memory tier, wherein selectively programming comprises:
  - in response to determining that at least one of SLC and MLC memory tiers is full, selectively replacing data in the at least one SLC and MLC memory tiers determined to be full with an entry from the first or second candidate list.

29. A disk drive system for storing data received from a host, the system comprising:
- a magnetic medium configured to store data;
- a non-volatile memory capable of supporting both a multi-level cell (MLC) memory tier and a single-level cell (SLC) memory tier; and
- a controller configured to access at least the non-volatile memory in response to receiving a storage access command from the host, the storage access command comprising an address in the magnetic medium configured to store a data value, the controller further configured to:
  - determine a metric corresponding to a frequency of access by the host;
  - determine a placement of the data value in one of first and second candidate lists based on a comparison of the metric to a threshold; and
  - selectively program entries in the first and second candidate lists into the SLC memory tier or the MLC memory tier, the controller further configured to:
    - in response to determining that at least one of SLC and MLC memory tiers is full, selectively replace data in the at least one SLC and MLC memory tiers determined to be full with an entry from the first or second candidate list.

* * * * *